United States Patent [19]

Hassler et al.

[11] Patent Number: 5,532,491

[45] Date of Patent: Jul. 2, 1996

[54] X-RAY IMAGE SENSOR

[75] Inventors: Dietrich Hassler, Uttenreuth; Martin Hoheisel, Erlangen, both of Germany

[73] Assignee: Siemens Aktiengesellschaft, Munich, Germany

[21] Appl. No.: 505,662

[22] Filed: Jul. 21, 1995

[30] Foreign Application Priority Data

Aug. 19, 1994 [DE] Germany .................. 44 29 434.4

[51] Int. Cl.$^6$ .................................................... G01T 1/24
[52] U.S. Cl. ........................... 250/370.09; 378/98.8
[58] Field of Search .................. 250/370.09, 208; 378/98.8; 348/302; 257/428

[56] References Cited

U.S. PATENT DOCUMENTS

| | | | |
|---|---|---|---|
| 4,827,145 | 5/1989 | Arques | 378/98.8 |
| 4,945,242 | 7/1990 | Berger et al. | 250/370.11 |
| 4,945,243 | 7/1990 | Arques | 250/370.09 |

FOREIGN PATENT DOCUMENTS 0622851  11/1994  European Pat. Off. .

OTHER PUBLICATIONS

"Amorphous Silicon Arrays Develop A Medical Image," Street et al., Circuits and Devices, Jul., 1993, pp. 38–42.

Primary Examiner—Davis L. Willis
Assistant Examiner—Kiet T. Nguyen
Attorney, Agent, or Firm—Hill, Steadman & Simpson

[57] ABSTRACT

An x-ray image sensor has a matrix of radiation-sensitive detector elements, the detector elements being connected in two groups to a common read-out line on which bipolar signals are generated. Read-out signals of one polarity cause read-out of one of the groups of detector elements and read-out signals of the other polarity cause read-out of the other group. An image detector having high resolution but low technical outlay is thereby achieved.

8 Claims, 6 Drawing Sheets

X-RAY IMAGE SENSOR

BACKGROUND OF THE INVENTION

1. Field of the Invention

The present invention is directed to an X-ray image sensor of the type having a matrix of radiation-sensitive detector elements.

2. Description of the Prior Art

High-resolution image sensors having a matrix of radiation-sensitive detector elements can be employed for the production of a video image from X-ray image. Dependent on their area, these image sensors require a relatively large number of inputs and outputs for image processing, resulting in expensive technological demands that are reflected in the price of the image sensor.

SUMMARY OF THE INVENTION

An object of the present invention is to provide an X-ray image sensor that has high resolution but which is relatively inexpensive to produce.

The above object is inventively achieved in an X-ray image sensor, and in a method for operating an image sensor, wherein a matrix of radiation-sensitive detector elements is driven for generating image output signals, with the detector elements of the matrix being divided into two groups of detector elements, the two groups of detector elements sharing a common read out line on which bipolar read-out signals are generated. The read-out signals of one polarity cause read out of one of the groups of detector elements, and the read-out signals of the other polarity cause read out of the detector elements in the other group.

In the inventive X-ray image sensor and method, the number of inputs and outputs and the outlay for electronics connected therewith are reduced. No additional demands are made of the technology of the image sensor, so that added costs are avoided. In the inventive X-ray image sensor, a signal discrimination into two cases can be undertaken by means of the polarity of the control signals, so that a halving of the number of terminals compared to known image sensors, wherein control signals of only one polarity are used, is achieved.

DETAILED DESCRIPTION OF THE PREFERRED EMBODIMENTS

Figure 1:
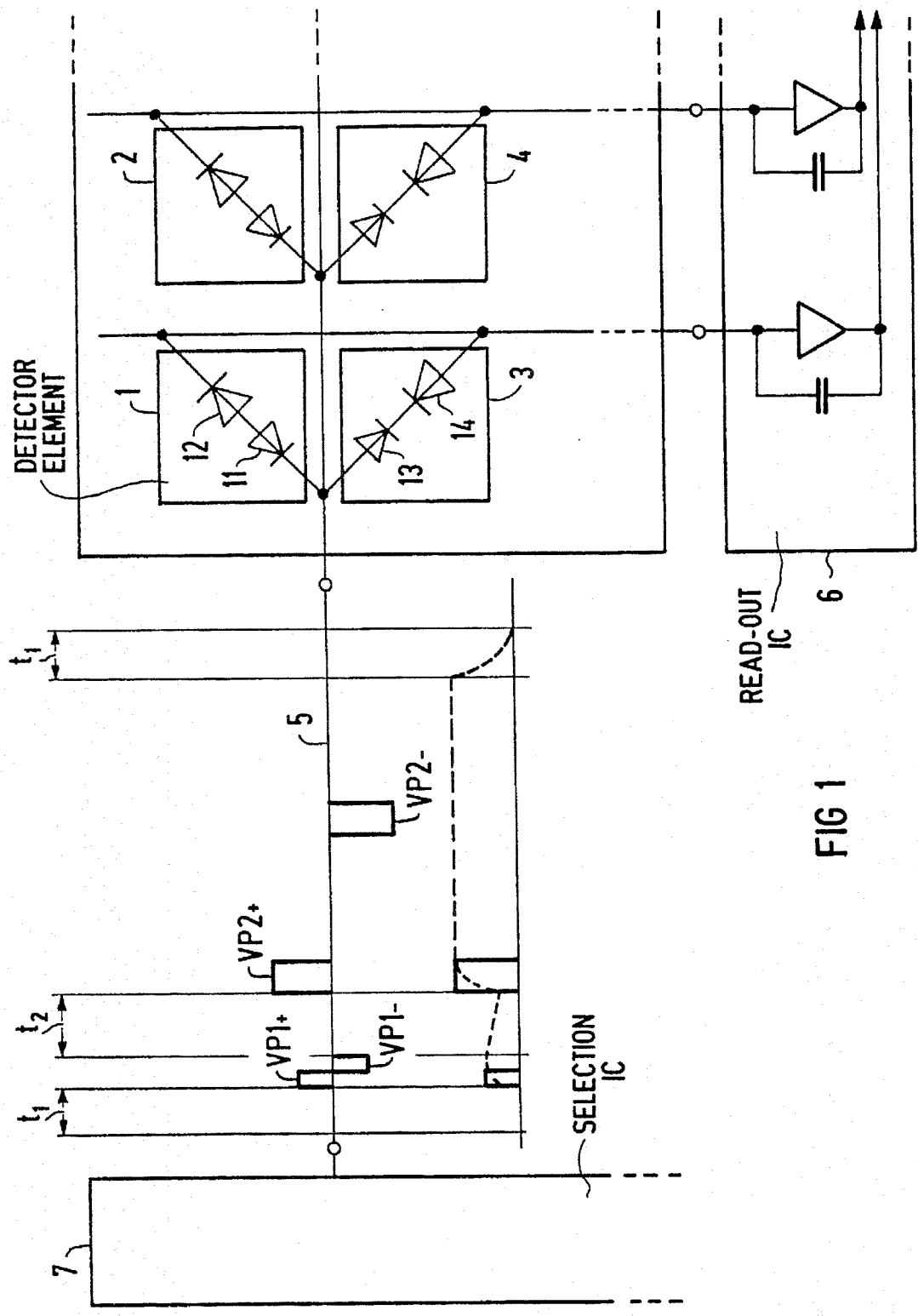
FIG. 1 is a schematic illustration of an X-ray image sensor of the invention also showing voltage pulses arising during the operation thereof.

FIG. 1 shows an X-ray image sensor having a matrix of radiation-sensitive detector elements 1,2,3,4, etc. For example, the image sensor may contain 512 rows and 540 columns. A common (shared) selection line 5 is provided for a row pair consisting of two neighboring rows. The pulse sequences required for an image cycle are shown on line 5. After the reset illumination in time t1, only the detector elements 3,4, etc. are loaded with VP1+ and only the detector elements 1,2, etc., are loaded with VP1−, since the diode conducting directions are opposite one another. The irradiation with X-rays ensues thereafter during the time t2. The detector elements 3,4 etc. on the same row are read out with the positive pulse VP2+ on the line 5. When the negative pulse VP2− is applied on the same line, then the detector elements 1,2 etc. in the same row are addressed because the diode directions are reversed compared to the detector elements 3,4 etc. The read-out ensues on the previous column lines. Both the read-out IC 6 as well as the selection IC 7 must be designed for bipolar operation.

Figure 2:
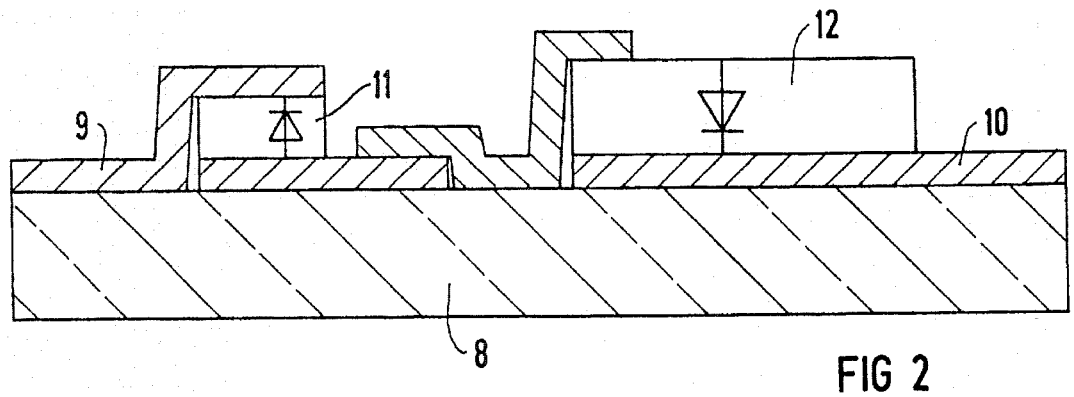
FIGS. 2 and 3 are cross-sections of the physical structure of detector elements in the X-ray image sensor of FIG. 1.
Figure 3:
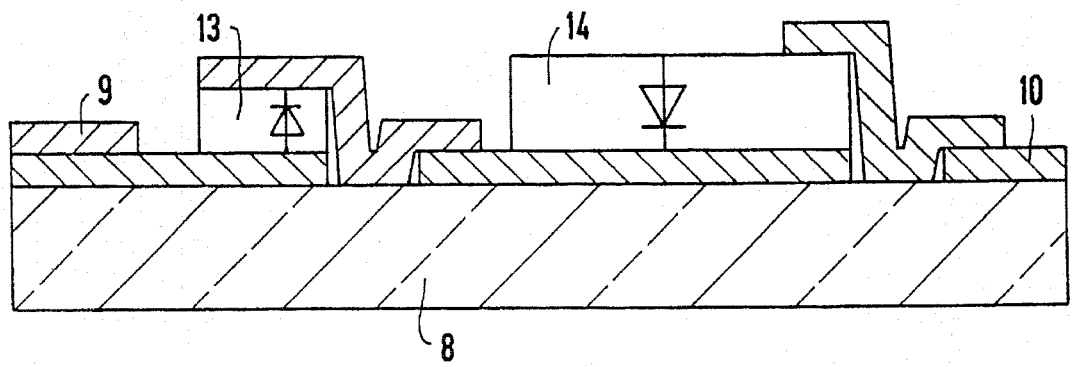

FIGS. 2 and 3 show how the detector elements with different diode direction can be constructed.

FIG. 2 shows the structure of a detector element for negative VP1 or negative VP2 selection. The insulation layers, passivation, etc., are not shown. FIG. 2 shows a glass substrate 8 on which the row line 9 and the column line 10 are applied, with the switching diode 11 and the photodiode 12 of the detector element 1 being schematically shown. The further detector elements 2, etc., of the first row are correspondingly constructed.

FIG. 3 shows the structure of a detector element for positive VP1 or positive VP2 selection. The switching diode of the detector element 3 is referenced 13 and the photodiode is referenced 14. The further detector elements of the second row are correspondingly constructed.

Figure 4:
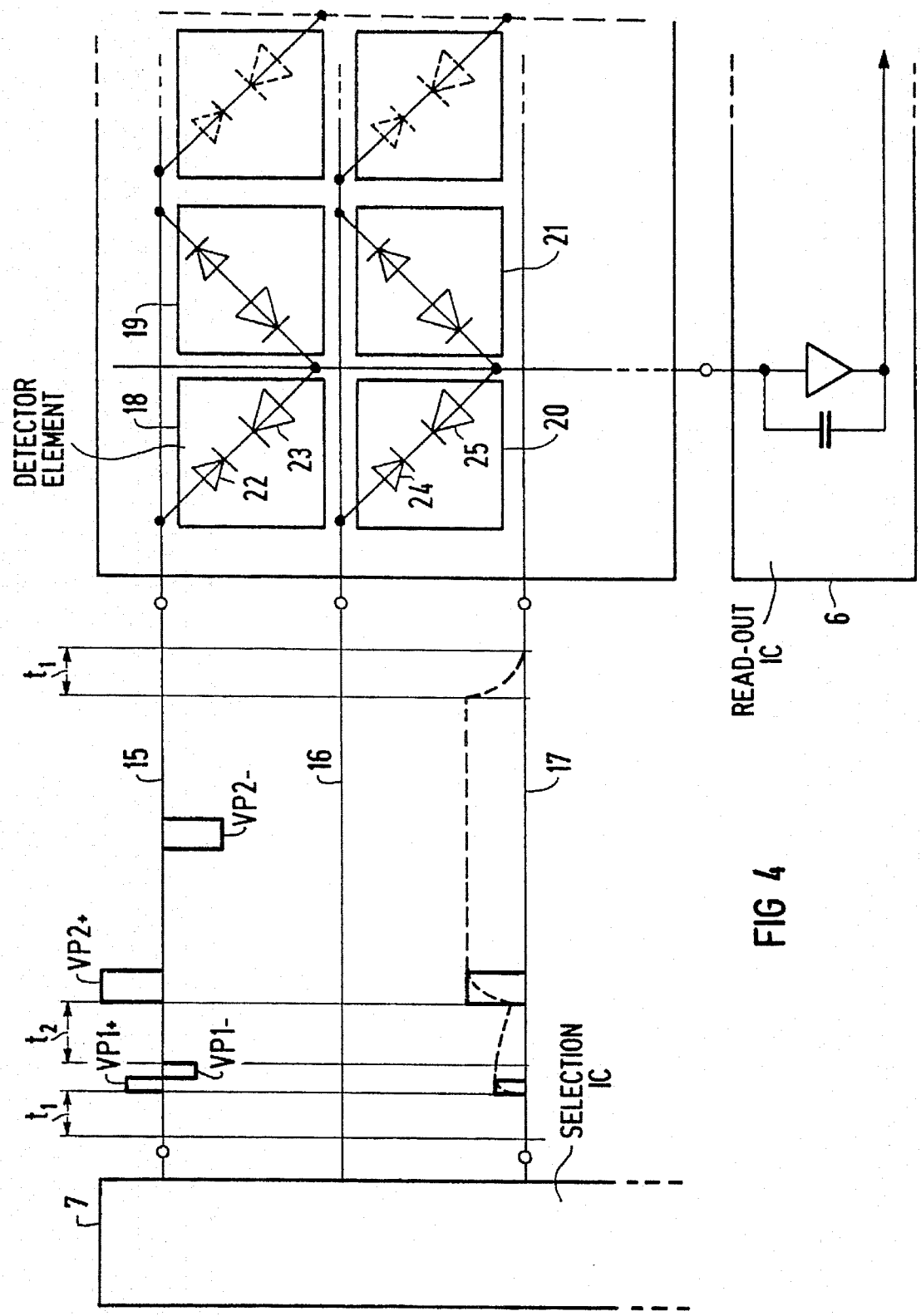
FIGS. 4–7 respectively illustrate four modifications of the X-ray image sensor of FIG. 1.

In FIG. 4, the pulse sequences are again shown on the selection lines 15,16,17, etc. The charging of the detector elements 18,19,20,21—as set forth earlier—ensues bipolarly with VP1+ and VP1− before irradiation with X-rays. The detector element 18 as well as every other detector element in the same row are read out with the positive pulse VP2+ on line 15. When the negative read-out pulse VP2− is applied on the same line, then the detector element 19 as well as every other one in that line are addressed because the diode directions are reversed compared to the detector element 18. Both the read-out IC 6 as well as the selection IC 7 must also be designed here for bipolar operation. The read-out time is doubled compared to the previous embodiment given the same duration of VP2, so that the image rate is roughly halved.

Figure 5:
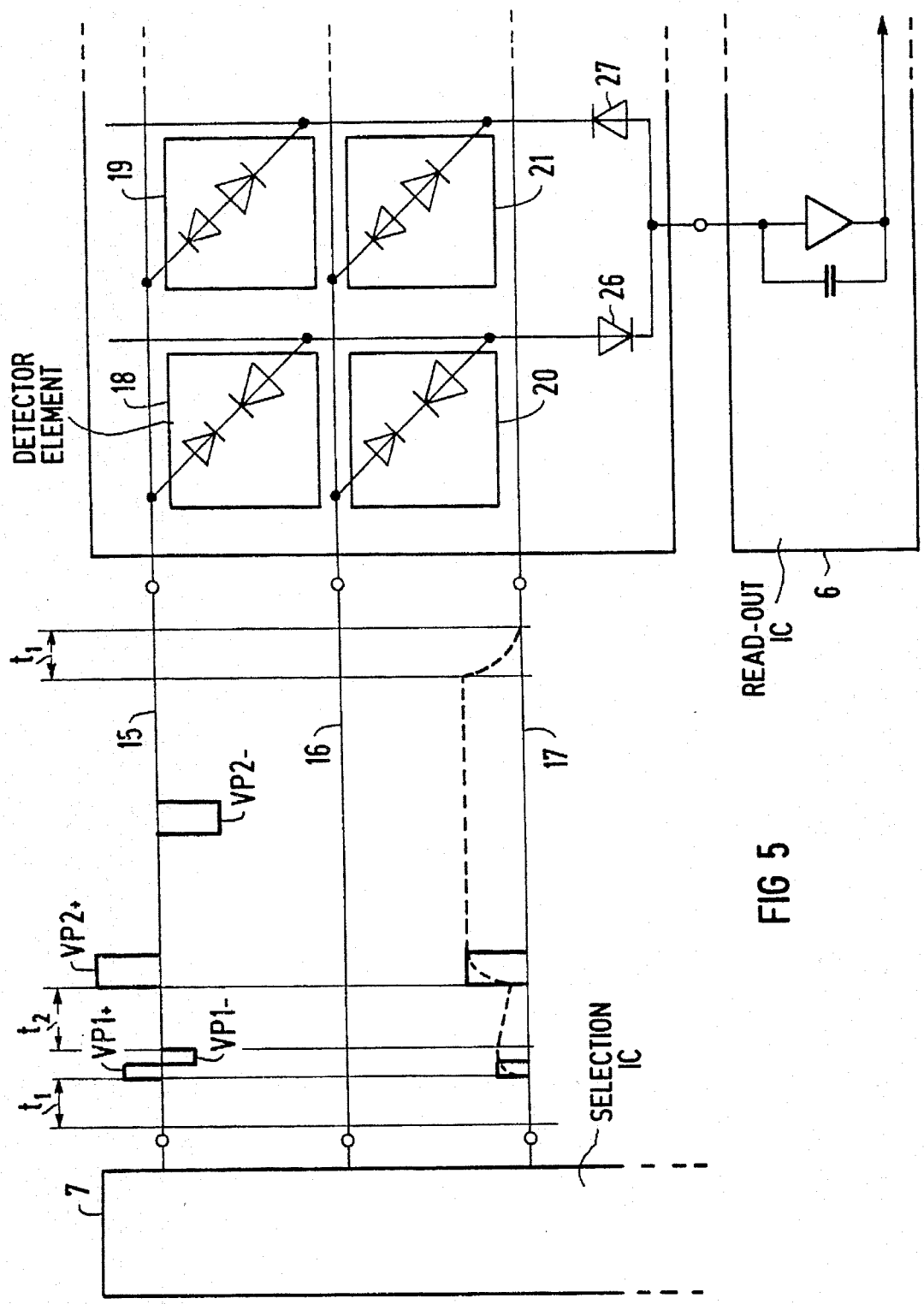

One disadvantage of the halved number of read-out lines is the increased parasitic capacitance which arises due to twice the number of inhibited detector elements. This leads to increased noise. The modification according to FIG. 5 avoids this. The reduction in the number of column terminals is undertaken first at the edge of the image sensor via pairs of diodes 26,27, etc. Like the switching diode 11,13, 22,24, these diodes 26,27, etc. are constructed on a substrate of amorphous silicon. Electrically, they are connected in series with the switching diodes. This increases the resistance and thus leads to degradation of the time behavior and noise level. Since the diodes 26,27, however, occur less frequently, they can be designed with a larger area, so that their on-state characteristics are lower in impedance and the aforementioned losses can remain small.

In FIG. 4, the switching diodes 22 and 24 as well as the photodiodes 23 and 25 are also shown for the detector elements 18 and 20. The outer detector elements are correspondingly constructed.

Figure 6:
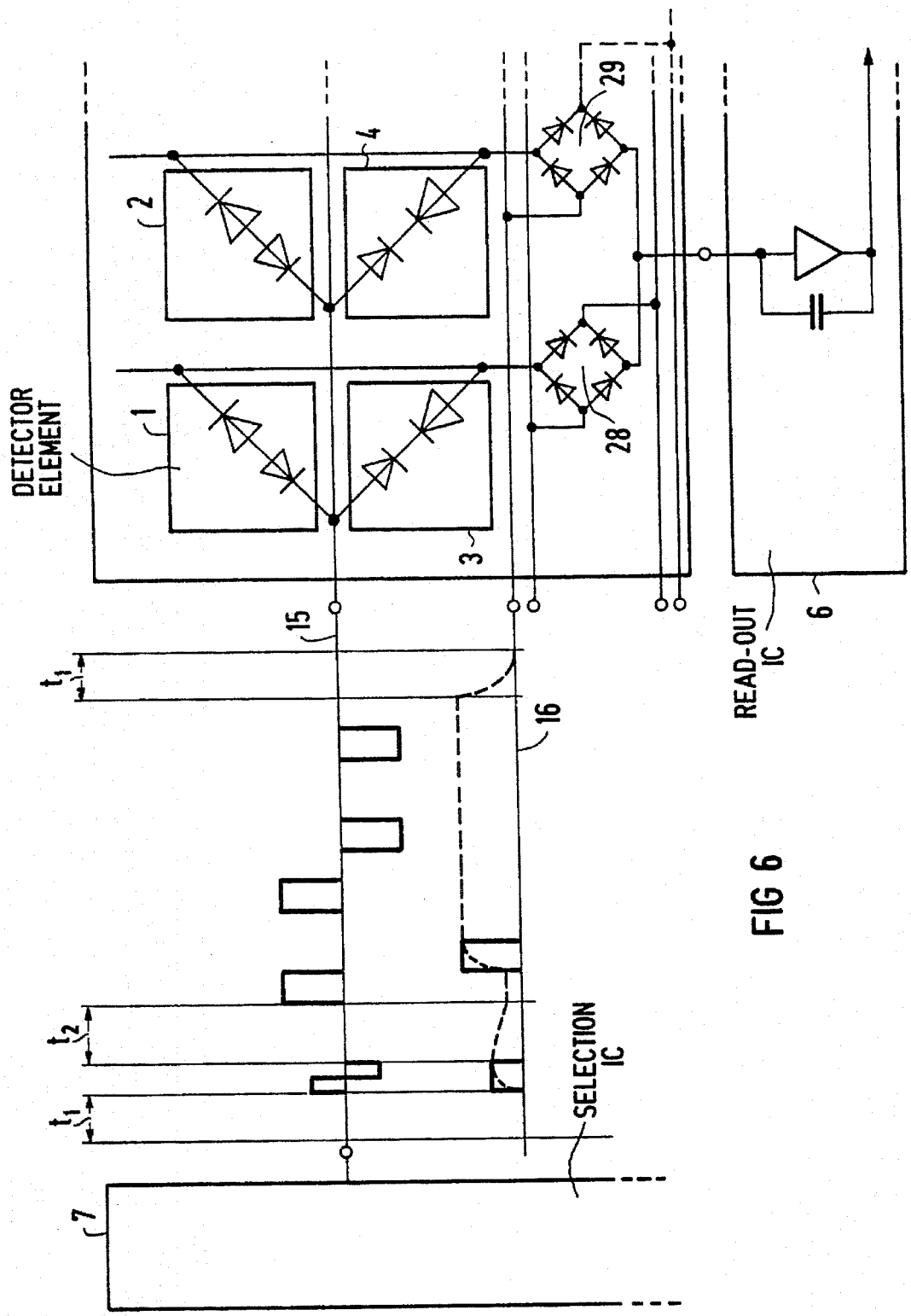

FIG. 6 shows the image sensor of FIG. 1 that is provided with two coupled bridge rectifiers 28 and 29 for column interrogation. In order to reduce costs, the number of columns to be connected to the read-out IC 6 can be halved. The read-out time is thus doubled. The drive of the bridge rectifiers 28 and 29 ensues via a floating potential current source. Diode switches have the advantage of not requiring any additional mask steps, as in the following modification.

Figure 7:
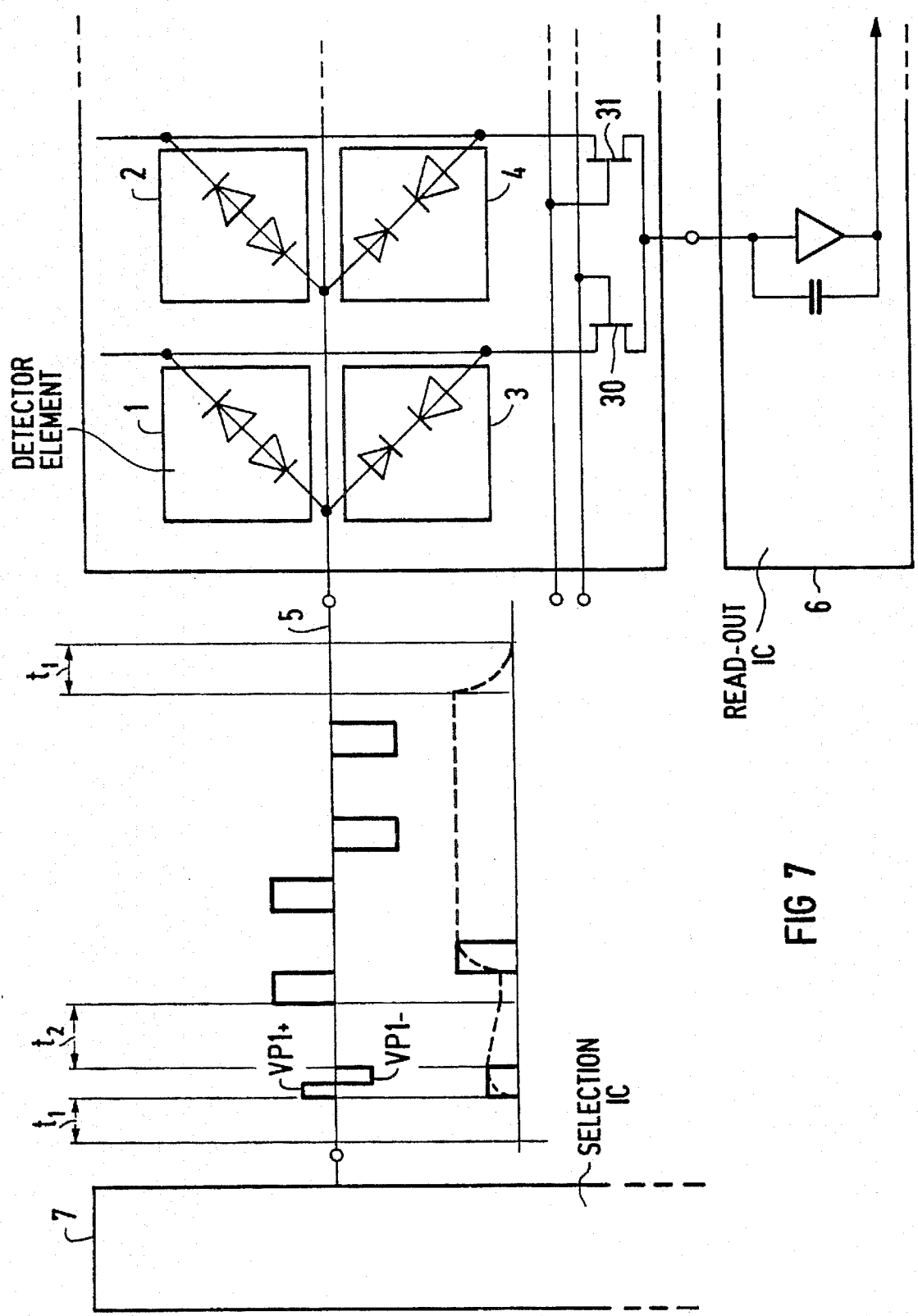

FIG. 7 likewise shows the image sensor of FIG. 1 that is provided with two coupled field effect transistors 30 and 31 for the column interrogation. All field effect transistors are conductive in the charging phase (VP1+, VP1−); only one pair of neighboring field effect transistors are conductive in the read-out phase.

Although modifications and changes may be suggested by those skilled in the art, it is the intention of the inventors to embody with the patent warranted hereon all changes and modifications as reasonably and properly come within the scope of their contribution to the art.

We claim as our invention:

1. An arrangement for converting an X-ray image into corresponding electrical signals, comprising:

an X-ray image sensor having a matrix composed of a plurality of radiation-sensitive detector elements, said detector elements comprising two respective groups of detector elements; and means for reading out said detector elements, connected to said detector elements by a common read out line which is shared by said two groups of detector elements, for generating bipolar read-out signals on said read out line for causing read-out of the detector elements of one of said groups with a read-out signal of one polarity and for causing read-out of the detector elements of the other of said groups with a read-out signal of an opposite polarity.

2. An arrangement as claimed in claim 1 wherein said matrix comprises a plurality of rows of said radiation-sensitive detector elements, and wherein said two groups of detector elements are formed by selected rows of said matrix.

3. An arrangement as claimed in claim 1 wherein said matrix comprises a plurality of columns of said radiation-sensitive detector elements, and wherein said groups of detector elements are formed by respective columns of said matrix.

4. An arrangement as claimed in claim 3 wherein said columns of said matrix comprises a plurality of pairs of neighboring columns with one column in each pair belonging to one of said groups of detector elements and the other column in the pair belonging to the other of said groups of detector elements, and wherein the columns in each pair are connected to said read out line via respective, oppositely polarized diodes.

5. A method for converting an X-ray image into corresponding electrical signals, comprising the steps of:

arranging a plurality of radiation-sensitive detector elements in a matrix and dividing the detector elements in the matrix into two groups of detector elements;

connecting a common read out line to the two groups of detector elements;

supplying bipolar read-out signals on said read out line to said two groups of detector elements; and reading out the detector elements in one of said groups using read-out signals of one polarity and reading out signals from the detector elements in the other group using read out signals of an opposite polarity.

6. A method as claimed in claim 5 wherein said matrix has a plurality of rows of said radiation-sensitive detector elements, and wherein the step of dividing said detector elements into two groups comprises dividing said detector elements into groups formed by respective rows of said matrix.

7. A method as claimed in claim 5 wherein said matrix has a plurality of columns of said radiation-sensitive detector elements, and wherein the step of dividing said detector elements into two groups comprises dividing said detector elements into groups formed by respective columns of said matrix.

8. A method as claimed in claim 7 wherein the step of dividing said detector elements into two groups includes identifying a plurality of pairs of neighboring columns in said matrix with one column in each pair belonging to one group and the other column in each pair belonging to the other group, and wherein the step of connecting said detector elements to said read out line includes connecting the columns in each pair to said read out line via respective, oppositely polarized diodes.

* * * * *